United States Patent
Kouchi et al.

(10) Patent No.: US 8,933,739 B1
(45) Date of Patent: Jan. 13, 2015

(54) SEMICONDUCTOR INTEGRATED CIRCUIT (71) Applicant: Kabushiki Kaisha Toshiba, Minato-ku (JP)

(72) Inventors: Toshiyuki Kouchi, Kanagawa (JP);
Masahiro Yoshihara, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/021,493

(22) Filed: Sep. 9, 2013

Related U.S. Application Data (60) Provisional application No. 61/843,177, filed on Jul. 5, 2013.

(51) Int. Cl.
*H03K 3/00* (2006.01)
*H03K 3/012* (2006.01)

(52) U.S. Cl.
CPC .................................... *H03K 3/012* (2013.01)
USPC ............................ 327/218; 327/219; 327/215

(58) Field of Classification Search
USPC ................. 327/165, 166, 291–299, 374, 178; 326/93–98; 716/6
See application file for complete search history.

(56) References Cited

U.S. PATENT DOCUMENTS

| | | | |
|---|---|---|---|
| 6,539,454 B2 | 3/2003 | Mes | |
| 7,629,817 B2 * | 12/2009 | Nedovic et al. | 327/55 |
| 7,783,251 B2 * | 8/2010 | Rofougaran et al. | 455/20 |
| 2003/0155953 A1 * | 8/2003 | Hirata et al. | 327/236 |
| 2004/0259519 A1 * | 12/2004 | Su | 455/326 |
| 2008/0088365 A1 * | 4/2008 | Jang | 327/563 |
| 2011/0006826 A1 * | 1/2011 | Kang et al. | 327/254 |

FOREIGN PATENT DOCUMENTS

| | | |
|---|---|---|
| JP | 6-250817 | 9/1994 |
| JP | 2000-267757 | 9/2000 |
| JP | 2011-222117 | 11/2011 |

* cited by examiner

*Primary Examiner* — Brandon S Cole
(74) *Attorney, Agent, or Firm* — Oblon, Spivak, McClelland, Maier & Neustadt, L.L.P.

(57) ABSTRACT

According to one embodiment, a semiconductor integrated circuit includes a clock signal transmission path configured to transmit a clock signal and a data transmission path configured to transmit data. The clock signal transmission path has a first and a second clock signal transmission line configured to transmit a clock signal and a complementary clock signal. The data transmission path has a first and a second data transmission line configured to transmit data and complementary data. Each transmission path has an amplifier circuit of each signal and a level adjustment circuit for reducing amplitude of output from the amplifier circuit.

20 Claims, 5 Drawing Sheets

SEMICONDUCTOR INTEGRATED CIRCUIT

CROSS-REFERENCE TO RELATED APPLICATIONS

This application is based upon and claims the benefit of priority from U.S. Provisional Application No. 61/843,177, filed on Jul. 5, 2013; the entire contents of which are incorporated herein by reference.

FIELD

Embodiments described herein relate generally to a semiconductor integrated circuit provided with a clock signal transmission line and a data transmission line.

BACKGROUND

Conventionally, there has been known a semiconductor integrated circuit using pipeline processing in which data transmission between stages that perform predetermined signal processing is performed in synchronization with a clock signal.

Between the stages, the data transmission is performed through a data transmission path while the clock signal transmission is performed through a clock signal transmission path. There is a problem, however, that power consumption in the data transmission path or the clock signal transmission path becomes larger as scale of integration of the semiconductor integrated circuit becomes larger.

DETAILED DESCRIPTION

In general, according to one embodiment, a semiconductor integrated circuit has a first clock signal transmission line configured to transmit a clock signal and a second clock signal transmission line configured to transmit a complementary clock signal of the clock signal. It also has a clock amplifier circuit configured to amplify signal levels of the clock signal and the complementary clock signal. It also has a clock level adjustment circuit configured to supply the clock signal and the complementary clock signal to a succeeding clock signal transmission line after reducing amplitudes thereof amplified in the clock amplifier circuit. It also has a first data transmission line configured to transmit data and a second data transmission line configured to transmit complementary data of the data. It also has a data amplifier circuit configured to amplify the data and the complementary data. It also has a data level adjustment circuit configured to supply the data and the complementary data to a succeeding data transmission line after reducing amplitudes thereof amplified in the data amplifier circuit.

Exemplary embodiments of a semiconductor integrated circuit will be explained below in detail with reference to the accompanying drawings. The present invention is not limited to the following embodiments.

Figure 1:
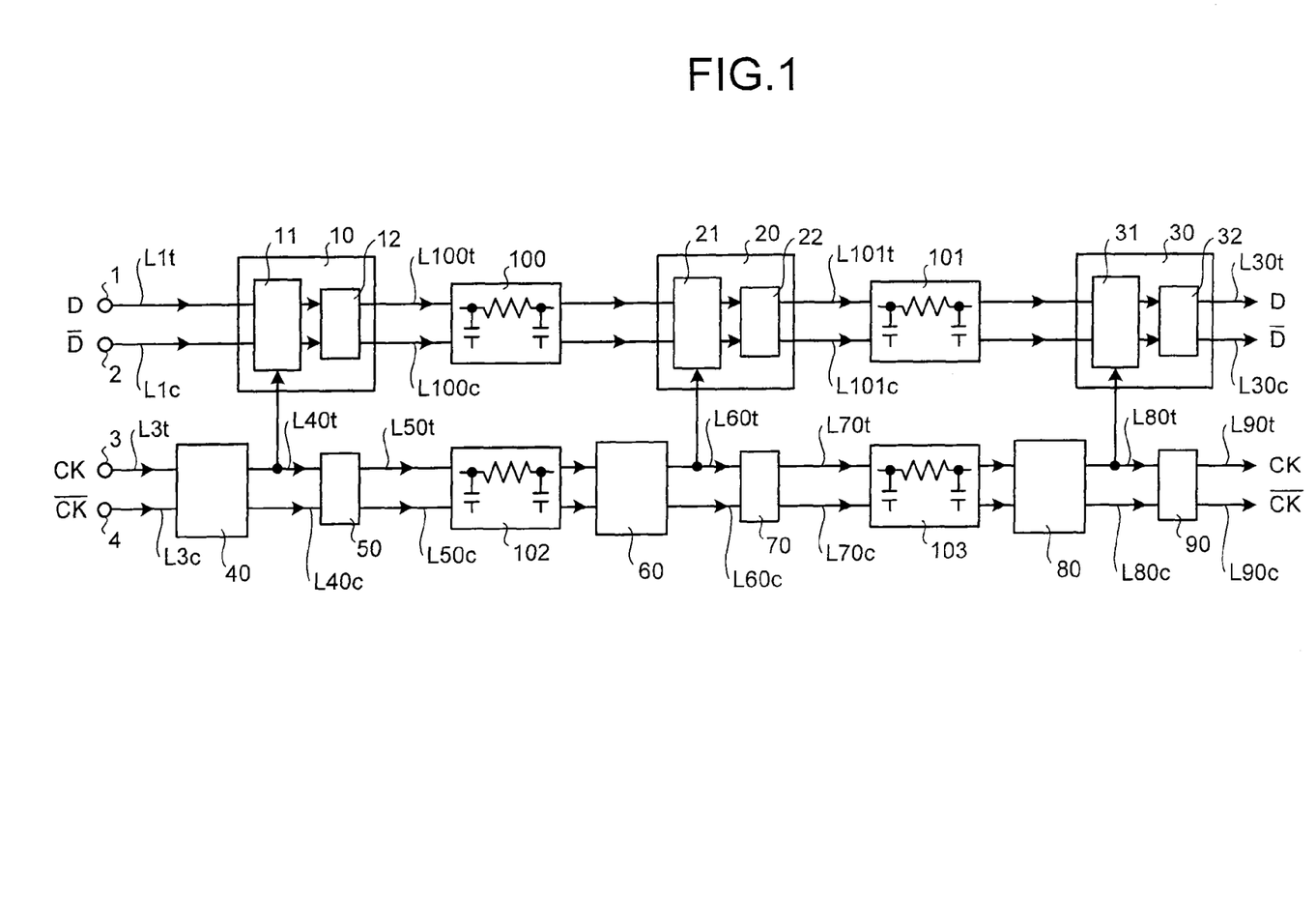
FIG. 1 is a view illustrating a semiconductor integrated circuit according to a first embodiment.

FIG. 1 is a view illustrating a semiconductor integrated circuit according to a first embodiment of the present invention. In this embodiment, a data input terminal 1 is provided. Data D having a binary level of a high level and a low level is input to the data input terminal 1. To a complementary data input terminal 2, a complementary data D bar (hereinafter, referred to as /D) having a signal level complementary to the data D is input. In other words, the complementary data /D has a state of the low level corresponding to the high level of the data D and a state of the high level corresponding to the low level of the data D. In this embodiment, the data D and the complementary data /D equivalent to data of one bit are illustrated. Therefore, in a case where there are multiple bits, the data D and the complementary data /D will be transmitted in the number corresponding to the number of the bits, but such configurations are omitted herein. The same applies hereinafter.

The data D and the complementary data /D are input to a stage 10 through a data transmission line L1t and a data transmission line L1c, each constituting a data transmission path. The stage 10 includes a data amplifier circuit 11 and a data level adjustment circuit 12. The data D and the complementary data /D are first supplied to the data amplifier circuit 11. In the data amplifier circuit 11, the data D and the complementary data /D are amplified to a predetermined amplitude level. By amplifying the data D and the complementary data /D transmitted in a small amplitude, the amplitude level of the data D and the complementary data /D is recovered. Input of the data D and the complementary data /D to the data amplifier circuit 11 is performed in synchronization with a clock signal CK. In the case where there are multiple bits, amplification of the data D is performed in synchronization with the clock signal CK in another corresponding stage 10 as well in the same way. Therefore, synchronization with the data D of another bit transmitted is performed in an amplification stage of the data amplifier circuit 11. A transmission line of the clock signal CK will be described below.

Output of the data amplifier circuit 11 is supplied to the data level adjustment circuit 12. In the data level adjustment circuit 12, an adjustment is made to reduce amplitudes of the data D and the complementary data /D, which are output signals of the data amplifier circuit 11. In other words, the data level adjustment circuit 12 outputs the output signals of the data amplifier circuit 11, after reducing the amplitudes thereof, to succeeding data transmission lines (L100t and L100c). By transmitting in a state of the amplitude-reduced data D and the amplitude-reduced complementary data /D, it is possible to decrease power consumption associated with data transmission.

The data D and the complementary data /D output from the stage 10 are supplied to a stage 20, which is the next stage, through the data transmission lines (L100t and L100c). A parasitic RC circuit 100 represents a parasitic resistance and a parasitic capacitance of the data transmission lines (L100t and L100c) between the stage 10 and the stage 20. In the stage 20, operation similar to that in the stage 10 is performed. That is, the data D and the complementary data /D on the data transmission lines (L100t and L100c) are captured in synchronization with the clock signal CK and are amplified by a data amplifier circuit 21. Output of the data amplifier circuit 21 is supplied to a data level adjustment circuit 22. In the data level adjustment circuit 22, the data D and the complementary data /D are adjusted such that the amplitudes thereof become small, and are output to succeeding data transmission lines (L101*t* and L101*c*). This is to suppress the power consumption by transmitting a signal in small amplitude.

Similarly, in a stage 30, amplification of the data D and the complementary data /D is performed by a data amplifier circuit 31, and an adjustment for reducing the amplitudes of the data D and the complementary data /D is performed by a data level adjustment circuit 32.

To a clock input terminal 3, the clock signal CK is supplied. The clock signal CK is used as a signal for implementing synchronization of operation in each of the above-described stages (10, 20, and 30). A complementary clock signal /CK, which is in a complementary relationship with the clock signal CK, is supplied to a complementary clock input terminal 4. The clock signal CK and the complementary clock signal /CK are supplied to a clock amplifier circuit 40 through clock signal transmission lines (L3*t* and L3*c*), each constituting a clock signal transmission path. In the clock amplifier circuit 40, amplification of the clock signal CK and the complementary clock signal /CK is performed. This is to amplify the clock signal CK and the complementary clock signal /CK transmitted in small amplitude to use as a drive signal for the data amplifier circuit 11.

Output of the clock amplifier circuit 40 is supplied to a clock level adjustment circuit 50. In the clock level adjustment circuit 50, an adjustment is made to reduce the amplitudes of the clock signal CK and the complementary clock signal /CK. By reducing the amplitudes of the clock signal CK and the complementary clock signal /CK, it is possible to suppress power consumption associated with transmission of these signals. Output of the clock level adjustment circuit 50 is supplied to a clock amplifier circuit 60 through clock signal transmission lines (L50*t* and L50*c*). A parasitic RC circuit 102 represents a parasitic resistance and a parasitic capacitance of the clock signal transmission lines (L50*t* and L50*c*). In the clock amplifier circuit 60, amplification of the clock signal CK and the complementary clock signal /CK is performed. Output of the clock amplifier circuit 60 is supplied to a clock level adjustment circuit 70 through clock signal transmission lines (L60*t* and L60*c*). In the clock level adjustment circuit 70, an adjustment of the amplitudes of the clock signal CK and the complementary clock signal /CK is performed.

Similarly, output of the clock level adjustment circuit 70 is supplied to a clock amplifier circuit 80 through clock signal transmission lines (L70*t* and L70*c*). A parasitic RC circuit 103 represents a parasitic resistance and a parasitic capacitance of the clock signal transmission lines (L70*t* and L70*c*). In the clock amplifier circuit 80, amplification of the clock signal CK and the complementary clock signal /CK is performed. Output of the clock amplifier circuit 80 is supplied to a clock level adjustment circuit 90, converted into the small-amplitude clock signal CK and the small-amplitude complementary clock signal /CK, and output to clock signal transmission lines (L90*t* and L90*c*).

According to the first embodiment, the data D and the complementary data /D as well as the clock signal CK and the complementary clock signal /CK are transmitted, on respective transmission lines, being converted into small-amplitude signals. Therefore, it is possible to decrease the power consumption associated with the transmission of the data D and the complementary data /D as well as the clock signal CK and the complementary clock signal /CK.

Figure 2:
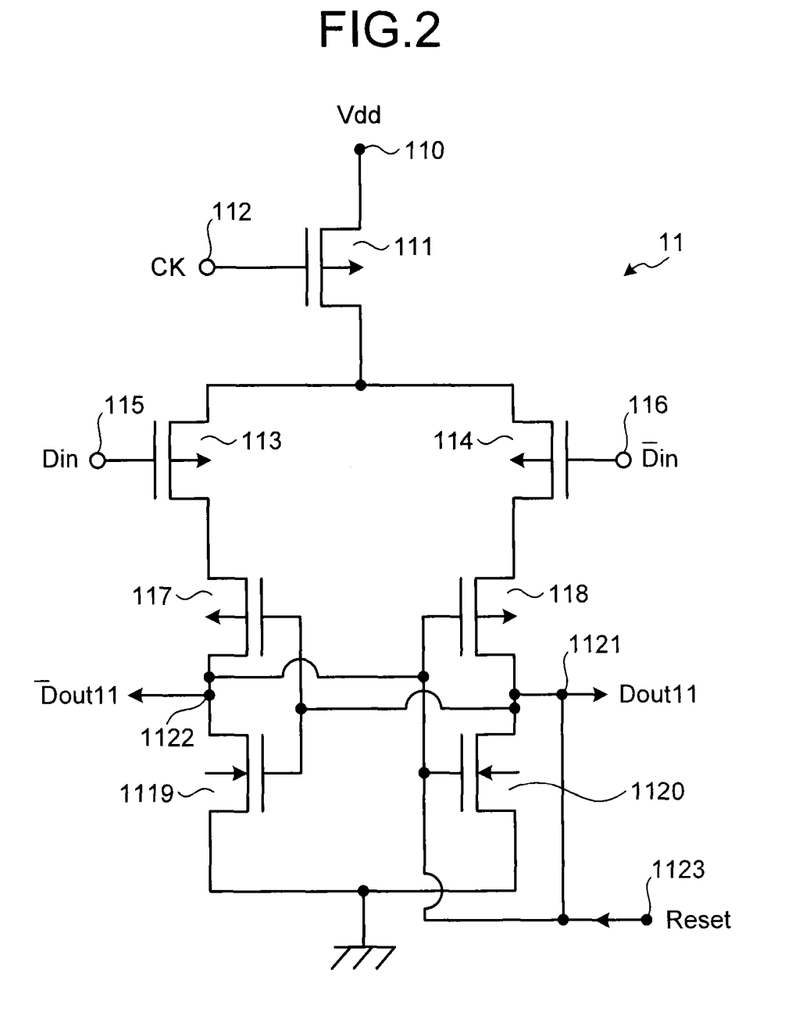
FIG. 2 is a view illustrating one embodiment of a data amplifier circuit.

FIG. 2 is a view illustrating one embodiment of a data amplifier circuit. The data amplifier circuit 11 in the stage 10 is illustrated as a representative example. The data amplifier circuit 11 has a PMOS transistor 111 having a gate electrode thereof connected to a terminal 112 and a source electrode thereof connected to a power source terminal 110. The clock signal CK is supplied to the terminal 112. To the power source terminal 110, a power source voltage Vdd for biasing is applied. To a drain electrode of the PMOS transistor 111, source electrodes of a PMOS transistor 113 and a PMOS transistor 114 are connected. The PMOS transistor 113 and the PMOS transistor 114 constitute a differential pair. Data Din of an input terminal 115 is supplied to a gate electrode of the PMOS transistor 113, and complementary data /Din of an input terminal 116 is supplied to a gate electrode of the PMOS transistor 114. The data Din represents the data D, which has been transmitted through the data transmission line L1*t*, and the data /Din represents the complementary data /D, which has been transmitted through the data transmission line L1*c*.

A drain electrode of the PMOS transistor 113 is connected to a source electrode of a PMOS transistor 117. A drain electrode of the PMOS transistor 117 is connected to a drain electrode of an NMOS transistor 1119. A source electrode of the NMOS transistor 1119 is grounded. A drain electrode of the PMOS transistor 114 is connected to a source electrode of a PMOS transistor 118. A drain electrode of the PMOS transistor 118 is connected to a drain electrode of an NMOS transistor 1120. A source electrode of the NMOS transistor 1120 is grounded. Gate electrodes of the PMOS transistor 117 and the NMOS transistor 1119 are connected commonly, and are connected to an output terminal 1121. Gate electrodes of the PMOS transistor 118 and the NMOS transistor 1120 are connected commonly, and are connected to an output terminal 1122. The PMOS transistor 117, the PMOS transistor 118, the NMOS transistor 1119, and the NMOS transistor 1120 constitute a flip-flop circuit.

The data Din applied to the gate electrode of the PMOS transistor 113 and the complementary data /Din applied to the gate electrode of the PMOS transistor 114, constituting the differential pair, are compared. Depending on a comparison result, output /Dout11 and complementary output /Dout11 are output from the output terminals (1121 and 1122). In a case where a level of the data Din supplied to the input terminal 115 is low, the output Dout11 from the output terminal 1121 becomes a low level, and the complementary output /Dout11, which is output from the output terminal 1122, becomes a high level. An amplitude level of the output signals at the output terminal 1121 and the output terminal 1122 is the power source voltage Vdd for the high level and the ground potential for the low level.

The output Dout11 from the output terminal 1121 and the complementary output /Dout11 from the output terminal 1122 are supplied to the data level adjustment circuit 12. Note that it is also possible to configure such that a latch circuit (not illustrated) is provided for keeping the output from the output terminal 1121 and the output terminal 1122, and output from the latch circuit is supplied to the data level adjustment circuit 12. A reset signal Reset for resetting the flip-flop circuit, which includes the PMOS transistor 117, the PMOS transistor 118, the NMOS transistor 1119, and the NMOS transistor 1120, is supplied to a terminal 1123. This is to prepare for a next operation of the data amplifier circuit 11. The reset signal Reset is supplied after an elapse of a predetermined period of time from the clock signal CK.

The PMOS transistor 111 constitutes a current source of the data amplifier circuit 11. Therefore, the data amplifier circuit 11 operates while the PMOS transistor 111 is on, or while the clock signal CK is at the low level. Therefore, synchronization can be implemented by using the clock signal CK. Furthermore, since it operates only while the clock signal CK is at the low level, the power consumption can be suppressed. Furthermore, since it is configured such that the data Din and the complementary data /Din, which are in a complementary relationship, are amplified in the data amplifier circuit 11 having a differential amplifier circuit configuration, it is possible to make a maximum use of the amplitudes of the data Din and the complementary data /Din.

Figure 3:
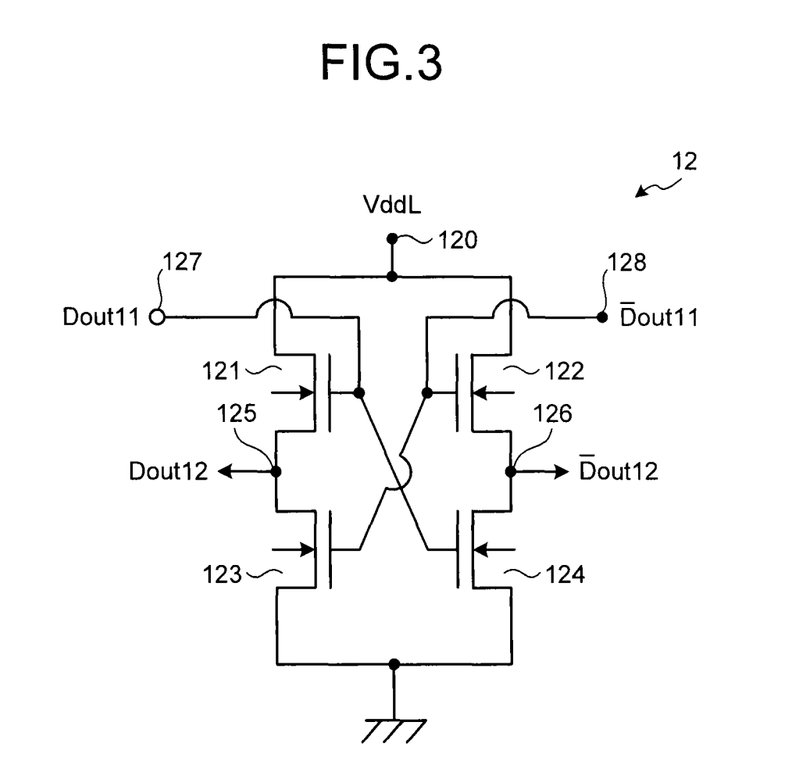
FIG. 3 is a view illustrating one embodiment of a data level adjustment circuit.

FIG. 3 is a view illustrating one embodiment of a data level adjustment circuit. The data level adjustment circuit 12 provided in the stage 10 is illustrated as a representative example. The data level adjustment circuit 12 has an NMOS transistor 121 having a source electrode thereof connected to a power source terminal 120 and a drain electrode thereof connected to an output terminal 125. To the power source terminal 120, a power source voltage VddL is applied. A source electrode of an NMOS transistor 122 is connected to the power source terminal 120, and a drain electrode thereof is connected to an output terminal 126. A drain electrode of an NMOS transistor 123 is connected to the output terminal 125, and a source electrode thereof is grounded. A drain electrode of an NMOS transistor 124 is connected to the output terminal 126, and a source electrode thereof is grounded. Gate electrodes of the NMOS transistor 121 and the NMOS transistor 124 are connected commonly, and are connected to an input terminal 127 to which the output Dout11 from the data amplifier circuit 11 is supplied. Gate electrodes of the NMOS transistor 122 and the NMOS transistor 123 are connected commonly, and are connected to an input terminal 128 to which the complementary output /Dout11 from the data amplifier circuit 11 is supplied.

When the output Dout11, or the output from the output terminal 1121 of the data amplifier circuit 11, supplied to the input terminal 127 is at the high level, the NMOS transistor 121 and the NMOS transistor 124 are turned on. As a result, an output Dout12 from the output terminal 125 becomes a signal having a level of the power source voltage VddL, and an output /Dout12 from the output terminal 126 becomes the ground level. Similarly, when the output /Dout11, or the output from the output terminal 1122 of the data amplifier circuit 11, supplied to the input terminal 128 is at the high level, the NMOS transistor 122 and the NMOS transistor 123 are turned on. As a result, the output /Dout12 from the output terminal 126 becomes a signal having a level of the power source voltage VddL, and the output Dout12 from the output terminal 125 becomes the ground level. Accordingly, the level of the output signals from the output terminal 125 and the output terminal 126 become a signal having the power source voltage VddL and the ground levels. In other words, the level of the output signals from the data amplifier circuit 11, having the power source voltage Vdd and the ground levels, is adjusted to the level of the signals having the power source voltage VddL and the ground levels.

The output Dout12 and the output /Dout12, each having an adjusted amplitude level, are output to the succeeding data transmission lines (L100t and L100c) as signals representing the data D and the complementary data /D. By appropriately selecting the power source voltage VddL of the data level adjustment circuit 12, it is possible to adjust the amplitudes of the output Dout12 and the output /Dout12. By reducing the amplitudes of the output Dout12 and the output /Dout12, it is possible to suppress the power consumption associated with the transmission of the data D and the complementary data /D in the data transmission line. Note that the power source voltage VddL of the data level adjustment circuit 12 is set to be lower than the power source voltage Vdd of the data amplifier circuit 11 at least by a threshold Vth of the NMOS transistor. This is to turn the NMOS transistor 121 and the NMOS transistor 122 on.

Figure 4:
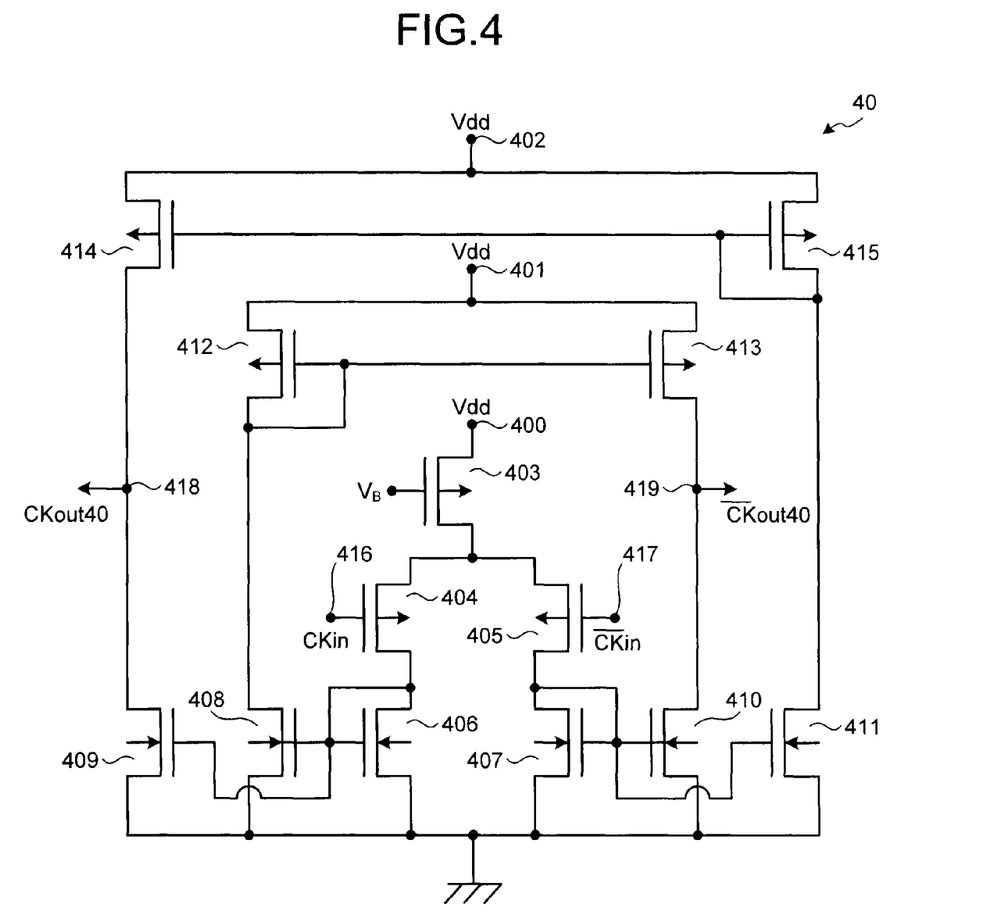
FIG. 4 is a view illustrating one embodiment of a clock amplifier circuit.

FIG. 4 is a view illustrating one embodiment of a clock amplifier circuit. The clock amplifier circuit 40 is illustrated as a representative example. The clock amplifier circuit 40 has a PMOS transistor 403 having a source electrode thereof connected to a power source terminal 400 and a gate electrode thereof to which a bias voltage VB is applied. To a drain electrode of the PMOS transistor 403, source electrodes of a PMOS transistor 404 and a PMOS transistor 405, constituting a differential pair, are connected. To gate electrodes of the PMOS transistor 404 and the PMOS transistor 405, a clock signal CKin and a complementary clock signal /CKin are supplied. The clock signal CKin represents the clock signal CK transmitted through the clock signal transmission line L3t, and the complementary clock signal /CKin represents the complementary clock signal /CK transmitted through the clock signal transmission line L3c.

A drain electrode of the PMOS transistor 404 is connected to a gate electrode and a drain electrode of an NMOS transistor 406. A source electrode of the NMOS transistor 406 is grounded. The gate electrode of the NMOS transistor 406 is connected to gate electrodes of an NMOS transistor 408 and an NMOS transistor 409. Source electrodes of the NMOS transistor 408 and the NMOS transistor 409 are grounded. The NMOS transistor 406, the NMOS transistor 408, and the NMOS transistor 409 constitute a current mirror circuit.

A drain electrode of a PMOS transistor 405 is connected to a drain electrode and a gate electrode of an NMOS transistor 407. A source electrode of the NMOS transistor 407 is grounded. The gate electrode of the NMOS transistor 407 is connected to gate electrodes of an NMOS transistor 410 and an NMOS transistor 411. Source electrodes of the NMOS transistor 410 and the NMOS transistor 411 are grounded. The NMOS transistor 407, the NMOS transistor 410, and the NMOS transistor 411 constitute a current mirror circuit.

A drain electrode of the NMOS transistor 408 is connected to a drain electrode and a gate electrode of a PMOS transistor 412. A source electrode of the PMOS transistor 412 is connected to a power source terminal 401 to which the power source voltage Vdd is applied. The gate electrode of the PMOS transistor 412 is connected to a gate electrode of a PMOS transistor 413. A source electrode of the PMOS transistor 413 is connected to the power source terminal 401. The PMOS transistor 412 and the PMOS transistor 413 constitute a current mirror circuit. A drain electrode of the PMOS transistor 413 and a drain electrode of the NMOS transistor 410 are connected to an output terminal 419.

A drain electrode of the NMOS transistor 411 is connected to a drain electrode and a gate electrode of a PMOS transistor 415. A source electrode of the PMOS transistor 415 is connected to a power source terminal 402 to which the power source voltage Vdd is applied. A gate electrode of the PMOS transistor 415 is connected to a gate electrode of a PMOS transistor 414. A source electrode of the PMOS transistor 414 is connected to the power source terminal 402 to which the power source voltage Vdd is applied. The PMOS transistor 414 and the PMOS transistor 415 constitute a current mirror circuit. A drain electrode of the PMOS transistor 414 and a drain electrode of the NMOS transistor 409 are connected to an output terminal 418.

An output signal corresponding to a comparison result of the clock signal CKin supplied to an input terminal 416 and the complementary clock signal /CKin supplied to an input terminal 417 can be obtained from an output terminal 418 and an output terminal 419. When the clock signal CKin supplied to the input terminal 416 is at a low level, the PMOS transistor 404 is turned on. Therefore, the NMOS transistor 406, the NMOS transistor 408, and the NMOS transistor 409 are turned on. Accordingly, a clock output signal CKout40 from the output terminal 418 becomes the low level, which is the ground level. By the NMOS transistor 408 being turned on, the PMOS transistor 412 is turned on, and the PMOS transistor 413 is also turned on. Therefore, a complementary clock output signal /CKout40 from the output terminal 419 becomes the high level, which is the power source voltage Vdd level.

A signal level of the clock signal CKin from the input terminal 416 and the complementary clock signal /CKin from the input terminal 417, which are in a complementary relationship, is amplified, and signals having the high level, or the power source voltage Vdd, and the low level, or the ground potential, are output. Since in this configuration, the clock signal CKin and the complementary clock signal /CKin, which are in the complementary relationship, are amplified in the clock amplifier circuit 40 having a differential amplifier circuit configuration, it is possible to make a maximum use of the amplitudes of the clock signal CKin and the complementary clock signal /CKin. Furthermore, in response to the clock signal CKin and the complementary clock signal /CKin, which are in a complementary relationship, the clock amplifier circuit 40 is configured to amplify a change thereof directly, whereby it is possible to use an output signal from the clock amplifier circuit 40 as a clock signal for synchronizing the above-described data amplifier circuit 11.

Figure 5:
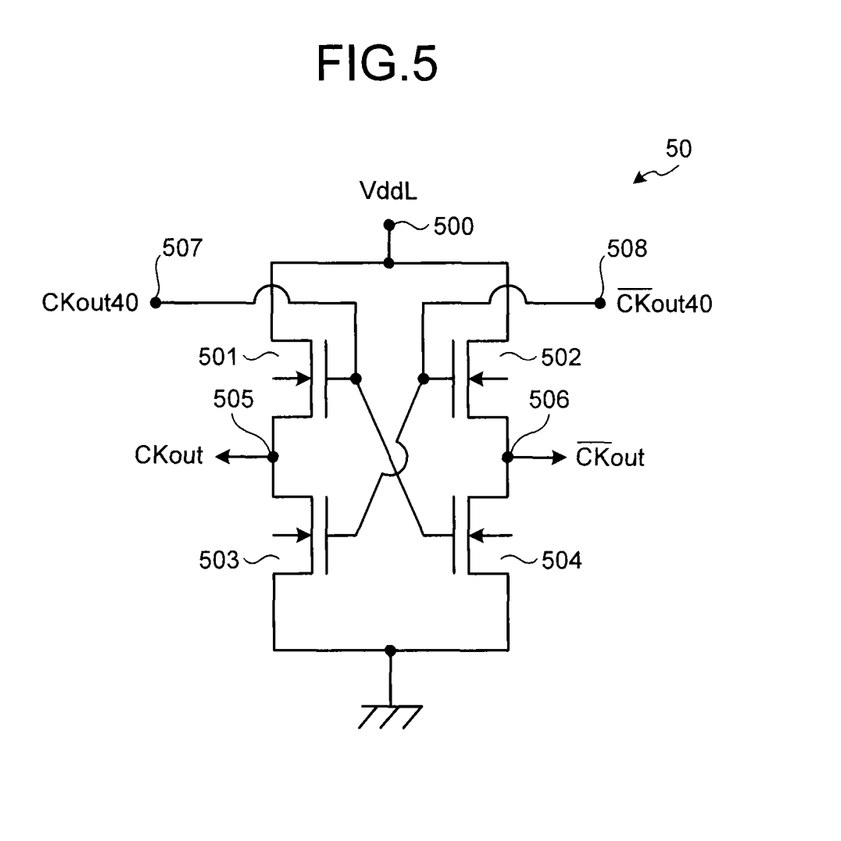
FIG. 5 is a view illustrating one embodiment of a clock level adjustment circuit.

FIG. 5 is a view illustrating one embodiment of a clock level adjustment circuit. The clock level adjustment circuit 50 is illustrated as a representative example. The clock level adjustment circuit 50 has an NMOS transistor 501 having a source electrode connected to a power source terminal 500 and a drain electrode connected to an output terminal 505. A source electrode of an NMOS transistor 502 is connected to the power source terminal 500, and a drain electrode is connected to an output terminal 506. A drain electrode of an NMOS transistor 503 is connected to the output terminal 505, and a source electrode thereof is grounded. A drain electrode of an NMOS transistor 504 is connected to the output terminal 506, and a source electrode thereof is grounded. Gate electrodes of the NMOS transistor 501 and the NMOS transistor 504 are connected commonly, and are connected to an input terminal 507 to which a clock output signal CKout 40, which is output from the clock amplifier circuit 40, is supplied. Gate electrodes of the NMOS transistor 502 and the NMOS transistor 503 are connected commonly, and are connected to an input terminal 508 to which a complementary clock output signal /CKout40, which is output from the clock amplifier circuit 40, is supplied.

When the clock output signal CKout40 supplied to the input terminal 507 is at a high level, the NMOS transistor 501 and the NMOS transistor 504 are turned on. Therefore, an output CKout from the output terminal 505 becomes a signal having the level of the power source voltage VddL, and an output /CKout from the output terminal 506 becomes the ground level. Similarly, when the signal /CKout40 supplied to the input terminal 508 is at a high level, the NMOS transistor 502 and the NMOS transistor 503 are turned on. Therefore, the output /CKout from the output terminal 506 becomes a signal having the level of the power source voltage VddL, and the output CKout from the output terminal 505 becomes the ground level. In other words, with respect to the level of the output from the output terminal 505 and the output terminal 506, the signal has a level of the power source voltage VddL as the high level and the ground level as the low level. In this way, the level of the output (CKout and /CKout) from the clock amplifier circuit 40 having the power source voltage Vdd and the ground potential is adjusted to be a signal having the power source voltage VddL and the ground potential.

From the clock level adjustment circuit 50, the amplitude level-adjusted output CKout and the amplitude level-adjusted complementary output /CKout are output as the clock signal CK and the complementary clock signal /CK to the succeeding clock signal transmission lines (L50t and L50c). By adjusting the power source voltage VddL of the clock level adjustment circuit 50 and by making an adjustment to reduce the amplitudes of the transmitted clock signal CK and the complementary clock signal /CK, it is possible to suppress the power consumption associated with the clock signal transmission. The power source voltage VddL of the clock level adjustment circuit 50 is set to be lower than the power source voltage Vdd of the clock amplifier circuit 40 at least by the threshold Vth of the NMOS transistor. This is to turn the NMOS transistor 501 and the NMOS transistor 502 on.

The embodiment has been described in which a PMOS transistor constitutes a differential pair that receives an input signal in the clock amplifier circuits (40, 60, and 80) and the data amplifier circuits (11, 21, and 31); however, it is also possible to configure such that an NMOS transistor constitutes a differential pair in an amplifier circuit. In a case where the NMOS transistor constitutes the differential pair in the data amplifier circuit, a PMOS transistor constituting the current source should also be an NMOS transistor. In this case, acquisition of data into the data amplifier circuit is performed with timing when the NMOS transistor is on state, or timing when the clock signal CK is at the high level.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor integrated circuit comprising:
   a first clock signal transmission line configured to transmit a clock signal;
   a second clock signal transmission line configured to transmit a complementary clock signal of the clock signal;
   a clock amplifier circuit configured to output the clock signal and the complementary clock signal after amplifying signal levels thereof;
   a clock level adjustment circuit configured to supply the clock signal and the complementary clock signal to succeeding clock signal transmission lines after reducing amplitudes thereof amplified in the clock amplifier circuit;
   a first data transmission line configured to transmit data;
   a second data transmission line configured to transmit complementary data of the data;
   a data amplifier circuit configured to amplify and output the data and the complementary data; and
   a data level adjustment circuit configured to supply the data and the complementary data to succeeding data transmission lines after reducing amplitudes thereof amplified in the data amplifier circuit.
2. The semiconductor integrated circuit according to claim 1, wherein an amplification operation in the data amplifier circuit is performed in synchronization with the clock signal.

3. The semiconductor integrated circuit according to claim 2, wherein the clock amplifier circuit has a differential amplifier circuit to which the clock signal and the complementary clock signal are input.

4. The semiconductor integrated circuit according to claim 3, wherein the clock amplifier circuit and the data amplifier circuit are biased by a first power source voltage, and the clock level adjustment circuit and the data level adjustment circuit are biased by a second power source voltage lower than the first power source voltage.

5. The semiconductor integrated circuit according to claim 4, wherein the clock amplifier circuit comprises a plurality of clock amplifier circuits and the clock level adjustment circuit includes:
  a first NMOS transistor having a source electrode that is grounded and a gate electrode to which an output signal of one of the clock amplifier circuits is applied;
  a second NMOS transistor having a source electrode that is grounded and a gate electrode to which an output signal of another of the clock amplifier circuits is applied;
  a third NMOS transistor having a source electrode to which the second power source voltage is applied, a gate electrode connected to the gate electrode of the second NMOS transistor, and a drain electrode connected to a drain electrode of the first NMOS transistor; and
  a fourth NMOS transistor having a source electrode to which the second power source voltage is applied, a gate electrode connected to the gate electrode of the first NMOS transistor, and a drain electrode connected to a drain electrode of the second NMOS transistor.

6. The semiconductor integrated circuit according to claim 5, wherein the data amplifier circuit has a differential amplifier circuit to which the data and the complementary data are input.

7. The semiconductor integrated circuit according to claim 6, wherein the differential amplifier circuit of the data amplifier circuit has a current source being on-off controlled by the clock signal.

8. The semiconductor integrated circuit according to claim 7, wherein the data amplified circuit comprises a plurality of data amplifier circuits and the data level adjustment circuit includes:
  a fifth NMOS transistor having a source electrode that is grounded and a gate electrode to which an output signal of one of the data amplifier circuits is applied;
  a sixth NMOS transistor having a source electrode that is grounded and a gate electrode to which an output signal of another of the data amplifier circuits is applied;
  a seventh NMOS transistor having a source electrode to which the second power source voltage is applied, a gate electrode connected to the gate electrode of the sixth NMOS transistor, and a drain electrode connected to a drain electrode of the fifth NMOS transistor; and
  an eighth NMOS transistor having a source electrode to which the second power source voltage is applied, a gate electrode connected to the gate electrode of the fifth NMOS transistor, and a drain electrode connected to a drain electrode of the sixth NMOS transistor.

9. A semiconductor integrated circuit comprising a clock signal transmission path configured to transmit a clock signal and a data transmission path configured to transmit data, wherein the clock signal transmission path transmits a clock signal and a complementary clock signal of the clock signal, and the data transmission path transmits data and complementary data of the data.

10. The semiconductor integrated circuit according to claim 9, wherein the clock signal transmission path includes:
  a clock amplifier circuit configured to amplify and output the clock signal and the complementary clock signal of the clock signal; and
  a clock level adjustment circuit configured to supply output from the clock amplifier circuit to the clock signal transmission path after reducing amplitude thereof.

11. The semiconductor integrated circuit according to claim 10, wherein the data transmission path includes:
  a data amplifier circuit configured to amplify and output the data and the complementary data of the data; and
  a data level adjustment circuit configured to supply output from the data amplifier circuit to the data transmission path after reducing amplitude thereof.

12. The semiconductor integrated circuit according to claim 11, wherein the clock amplifier circuit and the data amplifier circuit are biased by a first power source voltage, and the clock level adjustment circuit and the data level adjustment circuit are biased by a second power source voltage lower than the first power source voltage.

13. The semiconductor integrated circuit according to claim 12, wherein an amplification operation in the data amplifier circuit is performed in synchronization with the clock signal.

14. The semiconductor integrated circuit according to claim 13, wherein the clock amplifier circuit has a differential amplifier circuit to which the clock signal and the complementary clock signal are input.

15. The semiconductor integrated circuit according to claim 14, wherein the clock amplifie circuit comprises a plurality of clock amplifier circuits and the clock level adjustment circuit includes:
  a ninth NMOS transistor having a source electrode that is grounded and a gate electrode to which an output signal of one of the clock amplifier circuits is applied;
  a tenth NMOS transistor having a source electrode that is grounded and a gate electrode to which an output signal of another of the clock amplifier circuits is applied;
  an eleventh NMOS transistor having a source electrode to which the second power source voltage is applied, a gate electrode connected to the gate electrode of the tenth NMOS transistor, and a drain electrode connected to a drain electrode of the ninth NMOS transistor; and
  a twelfth NMOS transistor having a source electrode to which the second power source voltage is applied, a gate electrode connected to the gate electrode of the ninth NMOS transistor, and a drain electrode connected to a drain electrode of the tenth NMOS transistor.

16. The semiconductor integrated circuit according to claim 15, wherein the data amplifier circuit has a differential amplifier circuit to which the data and the complementary data are input.

17. The semiconductor integrated circuit according to claim 16, wherein the differential amplifier circuit of the data amplifier circuit has a current source being on-off controlled by the clock signal.

18. The semiconductor integrated circuit according to claim 17, wherein the data amplifier circuit comprises a plurality of data amplifier circuits and the data level adjustment circuit includes:
  a thirteenth NMOS transistor having a source electrode that is grounded and a gate electrode to which an output signal of one of the data amplifier circuits is applied;
  a fourteenth NMOS transistor having a source electrode that is grounded and a gate electrode to which an output signal of another of the data amplifier circuits is applied;
  a fifteenth NMOS transistor having a source electrode to which the second power source voltage is applied, a gate electrode connected to the gate electrode of the fourteenth NMOS transistor, and a drain electrode connected to a drain electrode of the thirteenth NMOS transistor; and a sixteenth NMOS transistor having a source electrode to which the second power source voltage is applied, a gate electrode connected to the gate electrode of the thirteenth NMOS transistor, and a drain electrode connected to a drain electrode of the fourteenth NMOS transistor.

19. A semiconductor integrated circuit comprising:

a clock signal transmission path configured to transmit a clock signal and a complementary clock signal of the clock signal;

a data transmission path configured to transmit data and complementary data of the data;

a clock amplifier circuit configured to output the clock signal and the complementary clock signal after amplifying signal levels thereof;

a clock level adjustment circuit configured to supply the clock signal and the complementary clock signal to a succeeding clock signal transmission path after reducing amplitudes thereof amplified in the clock amplifier circuit;

a data amplifier circuit configured to amplify and output the data and the complementary data; and a data level adjustment circuit configured to supply the data and the complementary data to a succeeding data transmission path after reducing amplitudes thereof amplified in the data amplifier circuit.

20. The semiconductor integrated circuit according to claim 19, wherein the clock amplifier circuit and the data amplifier circuit are biased by a first power source voltage, and the clock level adjustment circuit and the data level adjustment circuit are biased by a second power source voltage lower than the first power source voltage.

* * * * *